United States Patent [19]

Asai et al.

[11] Patent Number: 5,252,784
[45] Date of Patent: Oct. 12, 1993

[54] ELECTRONIC-PARTS MOUNTING BOARD AND ELECTRONIC-PARTS MOUNTING BOARD FRAME

[75] Inventors: Takuji Asai; Mitsuhiro Kondo; Atsushi Hiroi; Kinya Ohshima, all of Gifu, Japan

[73] Assignee: Ibiden Co., Ltd., Japan

[21] Appl. No.: 888,812

[22] Filed: May 27, 1992

Related U.S. Application Data

[63] Continuation-in-part of Ser. No. 797,032, Nov. 25, 1991.

[30] Foreign Application Priority Data

Nov. 27, 1990 [JP] Japan ............................ 2-327457
Feb. 19, 1991 [JP] Japan ............................ 3-24662
Dec. 26, 1991 [JP] Japan ............................ 3-344752

[51] Int. Cl.⁵ ..................................... H05K 1/00
[52] U.S. Cl. ........................... 174/267; 361/813; 257/672
[58] Field of Search .............. 174/267, 52.4; 361/401, 361/404, 421; 257/670, 672, 676; 206/329, 330, 331; 29/827

[56] References Cited

U.S. PATENT DOCUMENTS 3,431,548 3/1969 Busler .
4,897,602 1/1990 Lin et al. .
4,908,933 3/1990 Sagisaka et al. .................. 29/827
4,949,225 8/1990 Sagisaka et al. .................. 361/414
5,022,960 6/1991 Takeyama et al. ................ 156/643
5,170,328 12/1992 Kruppa .

FOREIGN PATENT DOCUMENTS 59-98545 6/1984 Japan .

OTHER PUBLICATIONS

English language summary of Japanese Patent Publication No. Sho-59-98545.

Primary Examiner—Leo P. Picard
Assistant Examiner—Cheryl R. Figlin
Attorney, Agent, or Firm—Bacon & Thomas

[57] ABSTRACT

An electronic-parts mounting board frame sheet includes a plurality of electronic-parts mounting board frames serially coupled into a single sheet. Each frame includes an electronic-parts mounting board with an insulating substrate, grouped leads protruding from the insulating substrate, an outer frame integrally formed with the grouped leads, and pilot holes, located in the outer frame, for indicating the positions of the grouped leads of the electronic-parts mounting board. Further, the grouped leads and the outer frame of each electronic-parts mounting board frame are integrally formed.

8 Claims, 13 Drawing Sheets

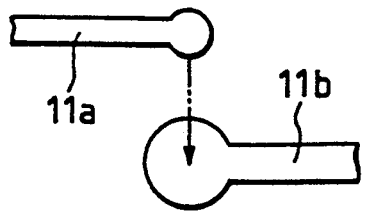
FIG. 8
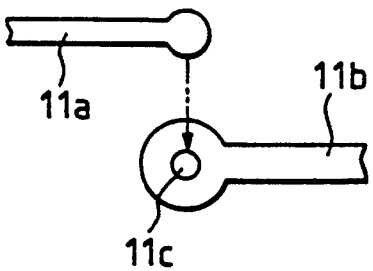
FIG. 9
FIG. 10
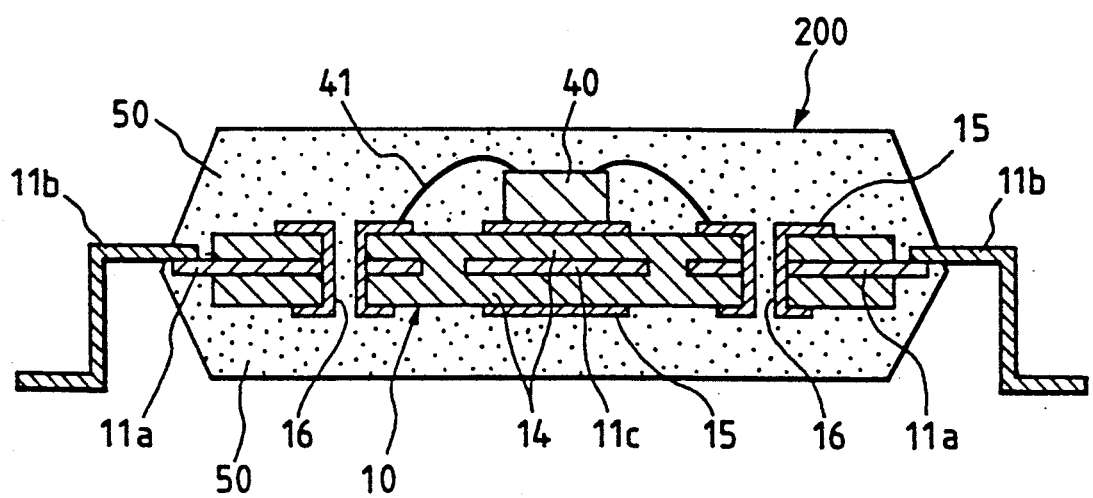

ELECTRONIC-PARTS MOUNTING BOARD AND ELECTRONIC-PARTS MOUNTING BOARD FRAME

This application is a continuation-in-part of U.S. patent application Ser. No. 797,032, filed Nov. 25, 1991.

BACKGROUND OF THE INVENTION

1. Field of the Invention

The present invention relates to an electronic-parts mounting board, and an electronic-parts mounting board frame with a plurality of electronic-parts mounting boards assembled thereinto.

2. Discussion of the Related Art

Various types of electronic-parts mounting boards have been proposed. One of those known electronic-parts mounting boards is an electronic-parts package, or a semiconductor device. In the package, after an electronic part is mounted on the board, the board is entirely covered for sealing purposes with a so-called resin mold, while the outer leads of the semiconductor device protrude outwardly from the resin mold.

An electronic-parts mounting board sealed with a resin mold is disclosed in Japanese Patent Laid-Open Publication No. Sho. 59-98545, entitled "Pellet Mounting Board," which is for a semiconductor device. The publication claims a part or "pellet" mounting board "wherein a pellet is mounted on a pellet mounting board with a conductive layer, bonding pads of said pellet are electrically connected to said conductive layer by a wire bonding method, and said conductive layer of said pellet mounting board is bonded to a lead frame." The disclosed pellet mounting board suffers from the following problems, however:

1) Solder is used for bonding the pellet mounting board (referred to as a board) to the conductive layer. Each portion (pad) subjected to the soldering lies on an insulating board. Accordingly, the pad tends to peel off the insulating board when it is heated for soldering.

2) The insulating board is located between the pads. Solder mistakenly left on the insulating board possibly may cause an electrical short between the pads.

3) The thermal expansion coefficient of the board is different from that of the lead frame. When the pellet (electronic part) is heated, the lead frame tends to peel off the board. One possible cause of the peel-off is warping of the lead frame.

4) The major surfaces of the insulating board do not fully utilize the space available to form the conductive circuits.

To cope with the above problems, an electronic-parts mounting board has been proposed which is constructed such that an insulating board is applied to both sides of the lead frame, to form a one piece construction, and the conductive circuits on the insulating board are electrically connected to the leads through the through-holes.

To be more specific, the proposed mounting board uses lead frames each having leads, connected by tie bars, that are constructed such that inner leads are electrically connected to the conductive circuits through the through-holes, and outer leads protrude from both the insulating board and the resin mold and are physically continuous.

The electronic-parts mounting board thus constructed still involves unsolved problems, however, as follows:

5) In recent usage of the electronic-parts mounting board, a plurality of electronic-parts mounting boards are assembled into a frame, in order to routinely and efficiently mount electronic parts on the board and to seal the structure with a resin mold. To assemble the insulating board based electronic-parts mounting boards into the lead frame, a single metal plate is punched to form leads in the locations where a plurality of electronic-parts mounting boards are to be formed. Insulating boards, separately formed, are coupled with the leads.

6) In the electronic-parts mounting boards thus assembled into one frame, if a part of the lead frame is defective, the whole lead frame must be treated as being defective. Accordingly, the remaining non-defective parts of the lead frame are wasted. The portions of the lead frame to be used for the electronic-parts mounting boards require especially delicate working for their formation. The cost to form those portions is higher than that to form other portions. Therefore, replacement of only those portions to be used for the electronic-parts mounting boards with non-defective portions would be very advantageous.

7) Since a plurality of electronic-parts mounting boards are assembled into a single lead frame, the whole lead frame must be individually designed and manufactured so as to have a shape in conformity with the shape of the electronic-parts mounting boards. In this respect, the versatility of the lead frame in usage is poor.

8) The electronic-parts mounting board must be subjected to electrical checks or tests in the stages of manufacturing the board. Simplification of the process of subjecting the board to electrical testing would be highly advantageous.

Studies made by the inventors to solve the above problems and to reduce the disadvantages of the electronic-parts mounting board have resulted in the present invention.

SUMMARY OF THE INVENTION

The present invention has been made in view of the above circumstances and has as an object the provision of an electronic-parts mounting board and an electronic-parts mounting board frame in which, when a part of the board and the board frame is defective, only the defective part need be replaced with a nondefective one, thereby providing a high production yield, high reliability, and low cost.

Another object of the invention is to provide an electronic-parts mounting board and an electronic-parts mounting board frame in which simplified electrical testing may be accomplished during manufacture.

An additional object of the invention is to provide an electronic-parts mounting board and an electronic-parts mounting board frame in which only a defective part need be replaced and in which handling and framing of the boards is simplified.

Yet another object of the invention is to provide an electronic-parts mounting board having a standardized inner lead frame and a mounting board frame with integral but separate, and therefore easily customized, outer lead frames for electrical connection with the standardized inner lead frame.

A final object of the invention is to provide an electronic-parts mounting board frame which is high in reliability and production yield, and in which the exact position of a pilot hole relative to a related group of leads is maintained.

To achieve the above objects, the invention preferably provides an electronic-parts mounting board frame constructed such that a plurality of electronic-parts mounting boards are assembled into a single frame, wherein a plurality of leads formed in each electronic-parts mounting board are formed from a member discrete from the member constituting the frame, and are electrically connected to the frame.

In the preferred electronic-parts mounting board frame, a plurality of electronic-parts mounting boards are separately formed. Those boards are assembled into a frame by means of leads. Therefore, a defective electronic-parts mounting board, may be replaced with a non-defective board without wasting other non-defective boards.

According to another aspect of the invention, there is provided an electronic-parts mounting board frame constructed such that a plurality of electronic-parts mounting boards are assembled into a single frame, wherein a plurality of leads for each electronic-parts mounting board include outer leads integral with the frame and inner leads formed of a discrete member separate from the frame and the outer leads, an insulating board is applied to both sides of the inner leads such that the inner leads protrude from the insulating board and the protruding inner leads are electrically connected to the outer leads, whereby the plurality of electronic-parts mounting boards are assembled into the frame. Thus, in this preferred electronic-parts mounting board frame, the leads include the inner leads to which the insulating board is applied, and the separate outer leads to be connected to the inner leads protruding from the insulating board. More specifically, the invention preferably includes an inner lead frame in which the inner leads are connected by tie bars, and an outer lead frame including outer leads which are integral with the frame, the inner and outer lead frames being electrically connected by, for example, soldering.

According to still another aspect of the invention, there is provided an electronic-parts mounting board frame constructed such that a plurality of electronic-parts mounting boards are assembled into a single mounting board frame, wherein a plurality of electronic-parts mounting boards are assembled into the mounting board frame, to form a one-piece construction in such a manner that an insulating board is applied to both sides of the lead frames, each lead frame including an individually formed outer frame which is fixed to the mounting board frame.

In this variation of the inventive electronic-parts mounting board frame, the outer frame is provided on the peripheral side of the leads to which the insulating board is applied. When the plurality of the electronic-parts mounting boards are assembled into one mounting board frame, the outer frame of each electronic-parts mounting board is fixed to the mounting board.

To achieve the final object of the invention, there is provide an electronic-parts mounting board frame sheet having a plurality of electronic-parts mounting board frames each including an electronic-parts mounting board with an insulating substrate, grouped leads protruding from the insulating substrate, an outer frame, and pilot holes located in the outer frame for indicating positions of the grouped leads on the electronic-parts mounting board. In a preferred embodiment of the electronic-parts mounting board sheet, a plurality of electronic-parts mounted board frames are serially coupled into a single sheet.

According to this embodiment of the invention, the grouped leads and the outer frame of the electronic-parts mounting board frame are integrally formed. Further, the plurality of electronic-parts mounting board frames to be coupled preferably includes only non-defective frames selected from among pre-manufactured electronic-parts mounting board frames.

In order to facilitate coupling, end parts of the electronic-parts mounting board frames which make up the sheet are formed with a step-shape. When the electronic-parts mounting board frames are coupled together, the stepped end parts of one electronic-parts mounting board frame is placed on a stepped end part of an adjacent electronic-parts mounting board frame, and then bonded together by spot welding.

Thus, in this final embodiment, a plurality of electronic-parts mounting board frames, each including an electronic-parts mounting board, are serially coupled together to form an electronic-parts mounting board frame sheet having a series of electronic-parts mounting board frames selected from among non-defective manufactured ones. As a result, the electronic-parts mounting board frame sheet thus formed is especially reliable. If the product of the electronic-parts mounting board frame sheet is damaged during subsequent processing steps, only the damaged electronic-parts mounting board frame need be replaced with a nondefective one. Replacement is facilitated by the use of the discrete mounting board frames. This leads to an improvement in the production yield of the electronic-parts mounting board frame sheet.

Further, the outer frame and the grouped leads of the electronic-parts mounting board frame are integrally formed. The outer frame contains pilot holes formed therein. When the electronic-parts mounting board frame sheet is subsequently processed, no distortion is transmitted to a related group of leads, thereby ensuring an exact positional relationship of the pilot hole to the related grouped leads.

BRIEF DESCRIPTION OF THE DRAWINGS

A The accompanying drawings, which are incorporated in and constitute a part of this specification illustrate embodiments of the invention and, together with the description, serve to explain the objects, advantages and principles of the invention. In the drawings.

FIGS. 8 and 9 are diagrams showing additional coupling modes;

FIG. 10 is a longitudinal sectional view showing in enlarged fashion a semiconductor device using the electronic-parts mounting board of the electronics-parts mounting board frame according to the second embodiment;

DETAILED DESCRIPTION OF THE PREFERRED EMBODIMENTS

Figure 1:
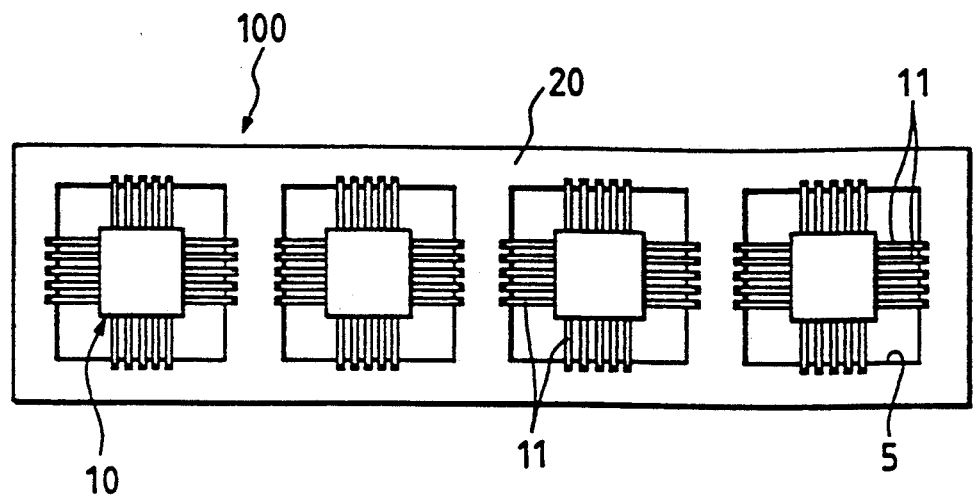
FIG. 1 is a plan view showing an electronic-parts mounting board frame according to a first embodiment of the invention.
Figure 2:
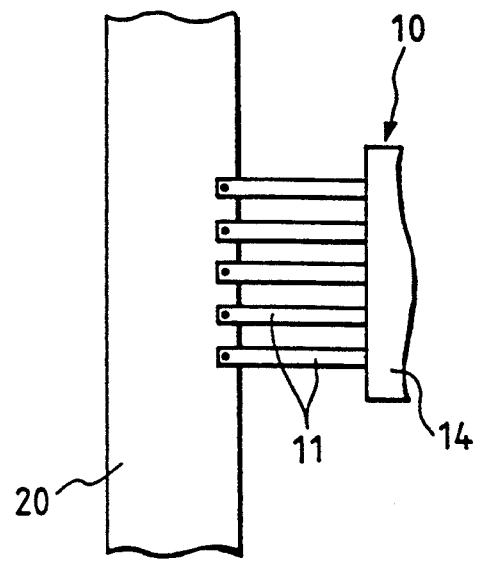
FIG. 2 is a plan view showing in enlarged fashion how each electronic-parts mounting board is coupled with a frame.
Figure 17:
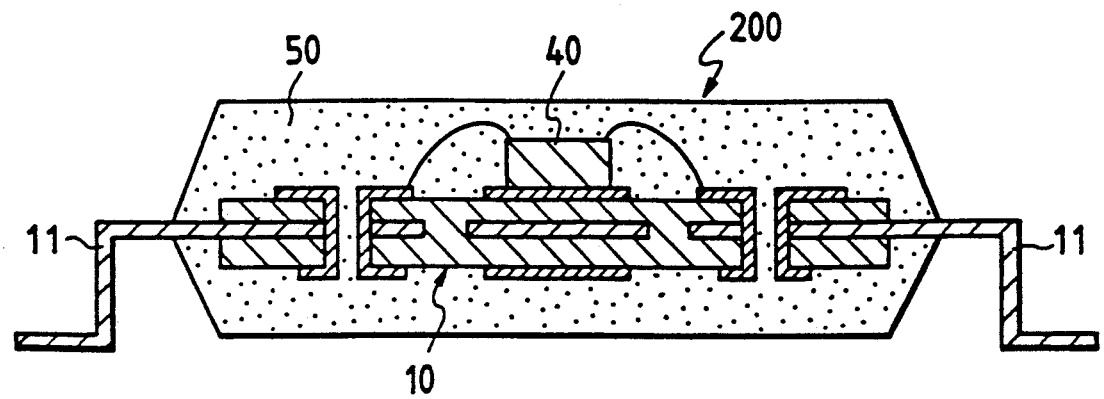
FIG. 17 is a longitudinal sectional view showing a semiconductor device constructed using the electronic-parts mounting board of FIG. 1.

FIGS. 1 and 2 illustrate an electronic-parts mounting board frame 100 according to a first preferred embodiment of the present invention. As shown therein, four electronic-parts mounting boards 10 are mounted on a single frame 20, to form a single unit. In each electronic-parts mounting board 10, an insulating board 14 is applied to the inner sides of groups of leads 11, and the inner sides of the boards and the leads groups are unified into a single piece construction. As shown in FIG. 10, conductive circuits 15 formed on the insulating board 14 are selectively and electrically connected to the grouped leads 11 through throughholes 16. The respective leads 11, as shown in FIG. 2, protrude from the insulating board 14. The electronic-parts mounting board 10, which is to be assembled into the electronic-parts mounting board frame 100, may be completed as a semiconductor device 200, after an electronic part 40 is mounted thereon. In this case, as shown also in FIG. 17, the end faces of a mold resin 50 thereof are positioned on the leads 11. Thus, the frame 20 is used only for supporting each electronic-parts mounting board 10 by means of the leads 11. In the semiconductor device 200 as shown in FIGS. 10 and 17, the frame is not used.

The frame 20, as shown in FIG. 1, is a plate-like member with a number of holes 5 for receiving the electronic-parts mounting boards 10. With the shape of the frame as illustrated, the frame 20 has a rigidity high enough not only to support the electronic-parts mounting boards 10 but also to allow the frame itself to be transferred to a mounting apparatus for mounting the electronic parts 40 and a transfer mold apparatus for the mold resin 50.

Figure 14:
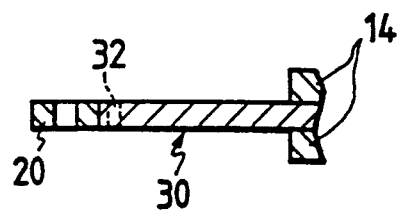
FIG. 14 is a sectional view taken on line XIV—XIV in FIG. 13.
Figure 15:
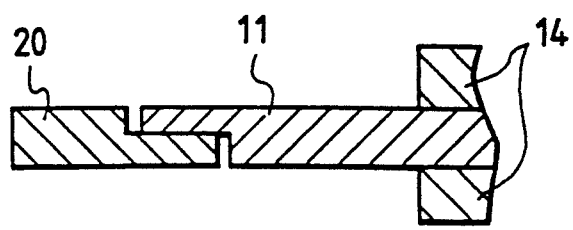
FIG. 15 is a sectional view showing another connection of the outer lead portions of the frame to the inner lead portions of the leads 11, the illustration showing typically one outer lead portion and the inner lead portion.

The electronic-parts mounting boards 10 are mounted on the frame 20 in such a manner that the leads 11, as shown in FIG. 2, are connected at their tips to the frame 20 by suitable means, such a spot welding or soldering, for example. In this instance, to connect the leads 11 to the frame 20, the leads 11 are directly placed on the frame 20, as shown in FIG. 2. Alternatively, the tips or ends of the leads may abut against the frame as shown in FIG. 14 or the half-etched ends of the leads may be coupled with the half-etched edge of the frame as shown in FIG. 15.

In the electronic-parts mounting board frame 100 thus constructed, which is the first embodiment of the invention, a plurality of electronic-parts mounting boards 10 are assembled into one frame 20 and fixed thereto by means of the grouped leads 11. With this construction, if one of the electronic-parts mounting boards 10 is defective, the defective board may be replaced with a non-defective one, while the remaining ones may be used as they are. The electronic-parts mounting board frame 100 is of course constructed so as to provide for efficient mounting of the electronic part 40 and to seal the substantially whole electronic part 40 within the mold resin 50, as shown in FIG. 10 or 17.

The electronic-parts mounting board frame 100 includes two separate members; one member is for the leads 11 for the electronic-parts mounting boards 10, and the other is for the frame 20 for supporting the electronic-parts mounting boards 10. As a result, the cost of manufacture of the electronic-parts mounting board frames 100 is reduced because the simpler structure members, i.e., the frames 20, and the more complicated members, such as leads 11, may be separately manufactured. Furthermore, the cost to manufacture the semiconductor devices 200 using the electronic-parts mounting boards 10 is also reduced. When the boards are used for the semiconductor devices 200, the frames 20 are not used. Those frames may be used later, if required.

The electronic-parts mounting boards 10 are individually manufactured as products having the leads 11. Therefore, those boards can be electrically tested board by board. The leads when electrically separated as shown in FIG. 2, may also be tested in a simple manner lead by lead.

A second embodiment of an electronic-parts mounting board frame 100 according to the invention will be described with reference to FIGS. 3 to 10. In this embodiment of frame 100, the leads 11 for connecting the electronic-parts mounting board 10 to external components or devices are each divided into two portions, an inner lead 11a and an outer lead 11b. The jointed portions of the inner and outer leads 11a and 11b are disposed within the mold resin 50, when the electronic-parts mounting boards 10 are completed as the semiconductor devices 200, as shown in FIG. 10. In the figures, a single electronic-parts mounting board 10 and its related parts are illustrated for simplicity. The frame 20 is located outside an outer lead frame 13 integral with groups of outer leads 11b. A plurality of outer lead frames 13 are assembled into a single frame 20, to form a single unit.

Figure 3:
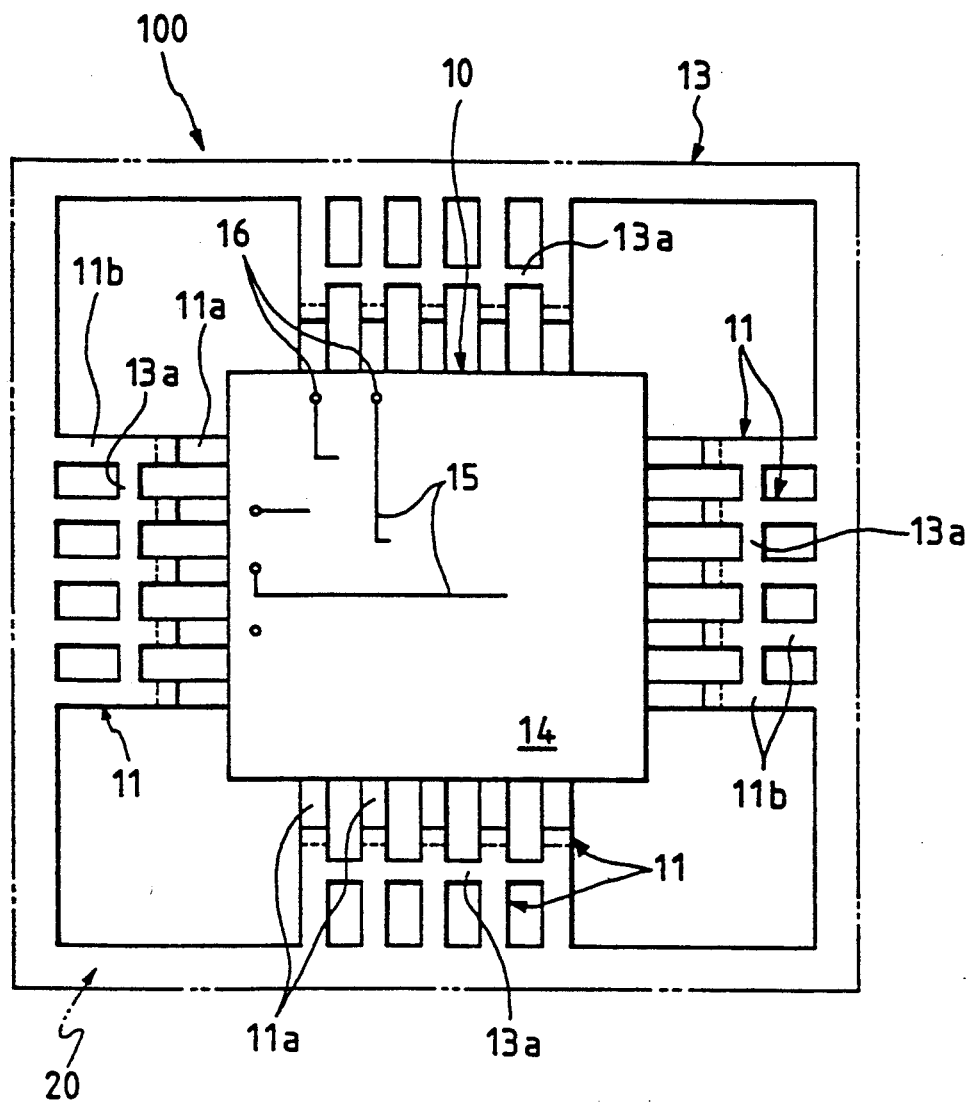
FIG. 3 is a plan view showing an electronic-parts mounting board frame according to a second embodiment of the invention, the illustration typically showing one electronic-parts mounting board in connection with a frame.

FIG. 3 is a plan view showing one of the electronic-parts mounting boards 10, which are to be assembled into an electronic-parts mounting board frame 100 according to the present invention. An insulating board 14 including conductive circuits 15 is disposed in the central part of the board. The outer leads 11b of the leads 11 protrude from the insulating board 14. The leads 11 of the board 10 are constructed such that the inner leads 11a of an inner lead frame 12 are electrically and physically connected to the outer leads 11b of the outer lead frame 13, respectively, by suitable means, such as by soldering.

Figure 4:
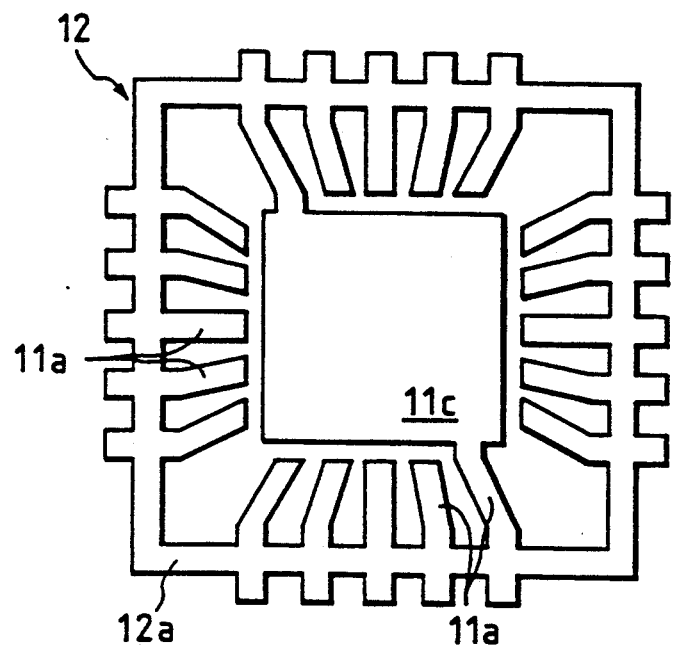
FIG. 4 is a plan view showing an inner lead frame of the electronic-parts mounting board used in the electronic-parts mounting board frames of FIG. 3.
Figure 5:
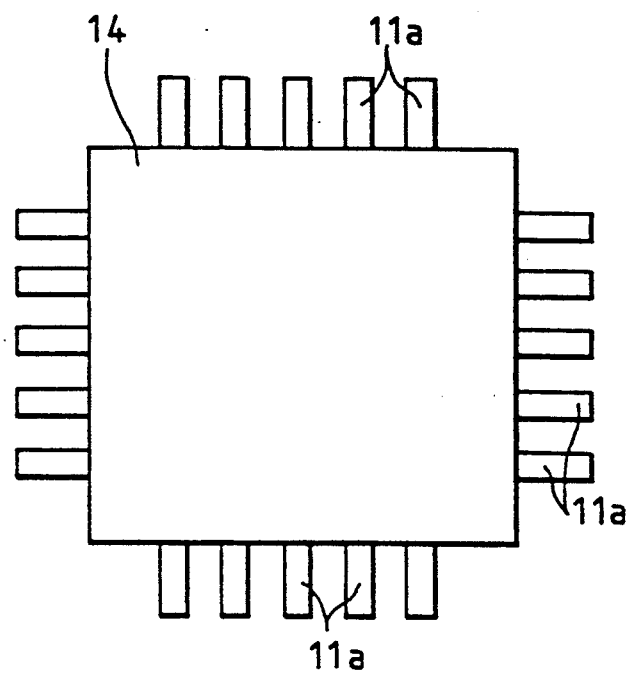
FIG. 5 is a plan view showing the inner lead frame when an insulating board is applied to the lead frame, and tie bars are removed from the lead frame.
Figure 6:
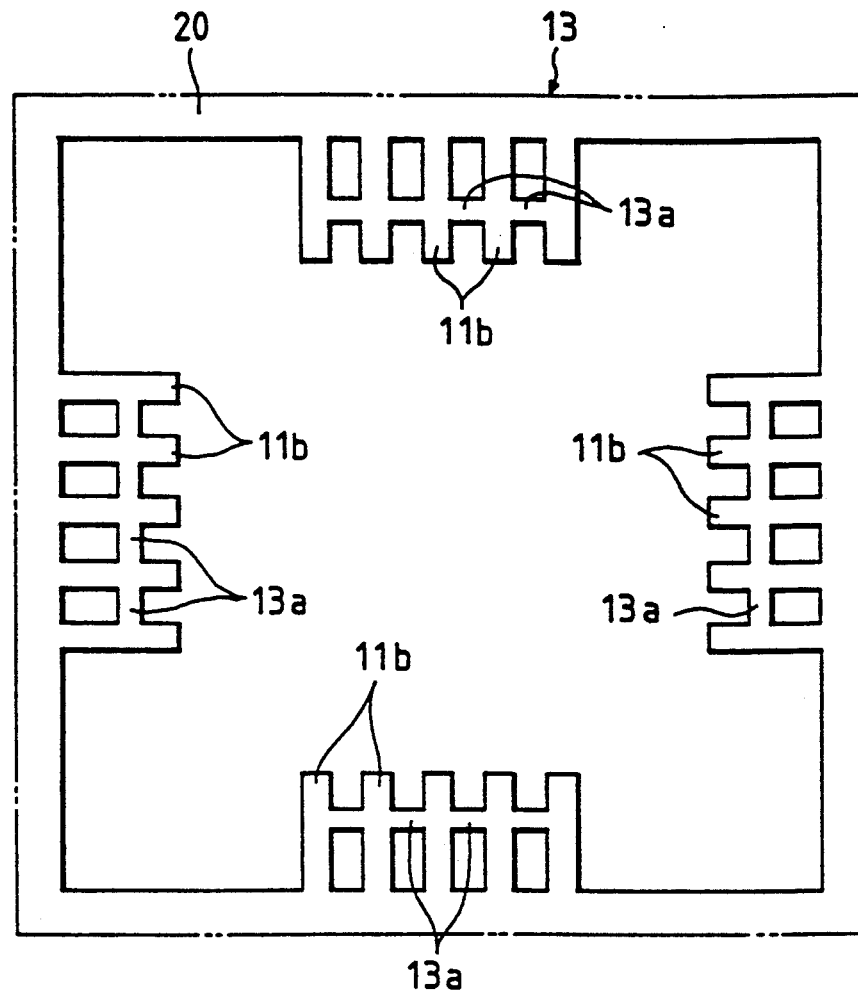
FIG. 6 is a plan view showing one of outer lead frames 13 with which the electronic-parts mounting board shown in FIG. 5 is to be coupled.

For forming the electronic-parts mounting boards 10, a plurality of inner lead frames 12 as shown in FIG. 4 and a plurality of outer lead frames 13 as shown in FIG. 6, which are assembled into the frame 20, are prepared. The inner lead frames 12 and the outer lead frames 13, which are assembled into the frame 20, are separately manufactured. The frame 12 shown in FIG. 4 is formed by punching or etching out of a metal plate inner leads 11a, which are connected by means of tie bars 12a. The metal plate is made of a material such as 42 alloy or copper composite material. An insulating board 14 on which conductive circuits 15 have been formed or are to be formed, is applied to the central part to form a unit, as shown in FIG. 5, in which the inner leads 11a are caused to protrude from the insulating board 14. The protrusion of the inner leads 11a is made because the inner leads 11a must be coupled with the outer leads 11b in later manufacturing steps. In the inner lead frame 12 shown in FIG. 4, a terminal 11c which will serve as a base terminal or ground terminal is formed in the central part toward which the inner leads 11a are extended. Preferably, some of the inner leads 11a are connected to a central terminal 11c. The central terminal 11c is, however, not essential to the invention.

As shown in FIG. 10, necessary conductive circuits 15 are formed on the inner lead frame 12 with the insulating board 14 applied thereto as shown in FIG. 5, and through-holes 16 are formed therein to electrically connect the conductive circuits 15 to the inner leads 11a. In the inner lead frame 12, both sides of which are covered with the insulating board 14, the tie bars 12a which tie the inner leads 11a together are cut off, for example, by a press machine, as shown in FIG. 5. As a result, although the inner leads are each electrically connected to the conductive circuits 15 on the insulating board 14 through the through-holes 16, they nevertheless protrude separately from the insulating board 14.

Let us consider the lead frames 13 which are assembled into the frame 20. Typically, in one outer lead frame 13, as shown in FIG. 6, the outer leads 11b are connected by tie bars 13a, the lead frame being punched out of a metal plate made of 42 alloy or copper composite material, for example. In the illustrated example, the number of inner leads 11a of the inner lead frame 12 is equal to the number of outer leads 11b of the outer lead frame 13. However, if required, the numbers of leads need be not equal to each other. For example, where the electronic-parts mounting board is used as a semiconductor device 200, the number of outer leads 11b of the outer lead frame 13 need only be that required for the semiconductor device 200.

In assembling the electronic-parts mounting board frame, the outer lead frames 13 thus constructed are positioned so that the end faces of the outer leads 11b respectively confront the end faces of the inner leads 11a of the inner lead frame 12. Then, those leads are electrically connected by soldering, for example, and the tie bars, 13a, which are now unnecessary, are cut off for removal by well known means. Finally, the electronic-parts mounting boards 10 each as shown in FIG. 3 are formed. In this case, the inner leads 11a and the outer leads 11b may be connected by using a) solder as just mentioned,
b) conductive adhesive,
c) anisotropic conductive rubber, or
d) any other suitable connection means.

If any of those is used, the connecting work is performed while securing the electrical conduction therebetween.

Figure 7:
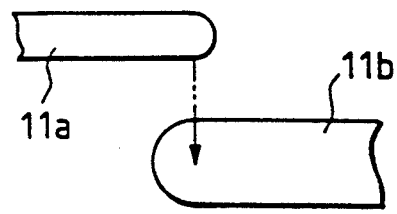
FIG. 7 is a diagram showing one of the coupling modes when the inner lead portions of the electronic-parts mounting board are connected to the outer lead portions of the outer lead frame, the illustration typically showing the connection of one inner lead portion to one outer lead portion, for simplicity.
Figure 18:
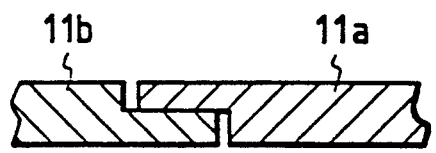
FIG. 18 is a sectional view showing a further connection of the inner and outer lead portions.

In connecting leads 11a and 11b, the lead shapes may be varied, providing beneficial effects. For example, the outer leads 11b may be relatively fat as shown in FIG. 7, to increase their rigidity. The leads 11a and/or 11b may also be shaped so as to have enlarged circular tips, as shown in FIG. 8. The enlarged circular tips are suitable for more securely holding solder or adhesive. Additionally, the tips of the leads may be apertured as shown in FIG. 9. With the apertured tips, solder or adhesive is even more securely held, increasing adhesive strength. Further, as shown in FIG. 18, the tips of the leads 11a and 11b may be half etched to form stepped parts. The stepped parts of the leads are laid one upon the other for coupling purposes as shown in FIG. 18. In this case, the jointed portion of the leads thus coupled have smoothed surfaces.

As already stated, in manufacturing a plurality of inner lead frames 12 and a plurality of outer lead frames 13 assembled into the frame 20, both frames making up the electronic-parts mounting board frame 100, a metal plate is formed into predetermined patterns by a suitable means, such as by punching. For example, a single metal plate may be punched to form the inner lead frames 12 and the outer lead frames 13. That is, a number of lead frames may be punched out of a single metal plate. In this case, the punching work is applied separately to the inner lead frames 12 and the outer lead frames 13. This simplifies their manufacture, and improves the efficiency of the manufacturing operation. In the instant embodiment, 150 inner lead frames 12 were punched out of a 1/6 square meter copper plate. 42 outer lead frames 13 corresponding to the inner lead frames 12 were punched out of a ⅙ square meter 42-alloy plate.

The electronic-parts mounting board frame 100 thus constructed is manufactured in the following manner: The insulating board 14 is pressed on both sides of each inner lead frame 12, so that those are combined into a single unit. Necessary components, e.g., conductive circuits 15, and through-holes 16 are formed on and in the structure. Thereafter, the tie bars 12a are cut off to form the inner leads 11a, which are caused to independently protrude form the insulating board 14. Then, the electrical connection of the inner leads 11a to the conductive circuits 15 through the through-holes 16 is checked for each of the electronic-parts mounting boards 10, and the electronic-parts mounting boards having defective electrical connections are removed. The non-defective electronic-parts mounting boards 10 are thus selected and, as shown in FIG. 3, assembled into the outer lead frames 13 which have been assembled into the frame 20.

An electronic part (e.g., a semiconductor element) 40, as shown in FIG. 10, is mounted on one or both sides of the insulating board 14 of each electronic-parts mounting board 10. The electronic part 40 and the conductive circuit 15 are electrically connected by a bonding wire 41. Finally, the structure is entirely sealed with mold resin 50 thus completing, in this example, an intended semiconductor device 200.

The electronic-parts mounting boards 10 making up the electronic-parts mounting board frame 100, in the second embodiment of the invention, may be used for forming the semiconductor device 200, as shown in FIG. 10. To form the board, the electronic part 40 is mounted on the electronic-parts mounting board 10. The structure is entirely sealed with the mold resin 50, in a state in which the outer leads 11b extend outwardly. The electronic-parts mounting boards 10 thus formed are assembled into the frame 20 by using the leads 11, as shown in FIG. 1. An additional embodiment to be described later employs an assembly in which a plurality of outer leads 11b of each electronic-parts mounting board 10 are assembled into a single frame 20, and in which the electronic-parts mounting boards 10 are assembled into the frame 20 and fixed thereto by the leads 11.

In the electronic-parts mounting board frame 100, the leads 11, as also shown in FIG. 3, are formed by connecting the inner leads 11a and the outer leads 11b by means of solder, for example. As already stated, the leads 11a and 11b are formed of different members. The outer leads 11b are protected by the frame 20. Those leads 11a and 11b when interconnected are electrically continuous and are shaped to correspond to that of frame 20. Specifically, the electronic-parts mounting board frame 100 is formed in such a way that the insulating board 14 is applied to both sides of the inner lead frames 12 as shown in FIG. 4, thereby combining them into single units, and the single units are assembled into outer lead frames 13, as shown in FIG. 3, and the outer lead frames 13 are enclosed by the frame 20 as shown in FIG. 6.

In the structure shown in FIG. 5, after the tie bars are cut off, electrical tests are performed on the inner leads 11a and the conductive circuits 15 coupled therewith, independently of the outer leads 11b. The result is that only non-defective inner lead frames 12 are used for the resultant electronic-parts mounting board frame 100. Therefore, the product quality, particularly the electrical performances, of the frames is improved in comparison with products in which the leads are continuous.

This fact also improves production yield in manufacturing the electronic-parts mounting board frames 100. The inner leads 11a and the outer leads 11b coupled with the frame 20, which cooperate to form the leads 11 and tend to be defective, may be electrically tested individually, before the electronic-parts mounting boards 10 containing them are assembled. Therefore, the electronic-parts mounting boards 10 assembled from those electrically tested leads 11a and 11b have much fewer defects, providing an excellent production yield.

In accordance with the invention, the inner lead frames 12 and the outer lead frames 13 coupled to the frame 20 are formed of different discrete members. Further, in forming the lead frames, increased tolerances for the inner and outer leads 11a and 11b are possible. The number of lead frames that can be punched out of a metal plate of a fixed are is three times the number of lead frames in which the leads consist of physically continuous inner and outer leads. For example, the present invention has been made to achieve a yield of 900 pieces/square meter, while in the case of continuous leads the maximum yield achieved was 336 pieces/square meter.

The inner lead frames 12, each having a preset number of inner leads 11a, are manufactured as standard products. In this case, the present number of the leads 11a is preferably as large as possible. The outer lead frames 13 having the outer leads 11b protected by the frame 20 may then be separately customized for different types of products. In this way, the electronic-parts mounting board frame 100 itself can be readily standardized while nevertheless permitting use in a variety of different applications. This is a very beneficial feature in view of recent market trends calling for customized manufacture of small numbers of products for each of a variety of different applications.

In the semiconductor device 200 based on the electronic-parts mounting board frames 100, the outer leads 11b not only extend outside the device 200 but furthermore are designed to be directly connected to other boards. Therefore, the outer leads 11b must be sufficiently rigid to satisfy such usages. In the electronic-parts mounting board frame 100, different members are used for the inner lead frames 12 of the inner leads 1 la and the outer lead frames 13 of the outer leads 11b. Therefore, the member selected for the outer lead frames 13 may have a higher rigidity than the member for the inner lead frames 12. The electronic-parts mounting board frames 100 may be designed so that their outer leads 11b have satisfactorily high rigidity.

Figure 11:
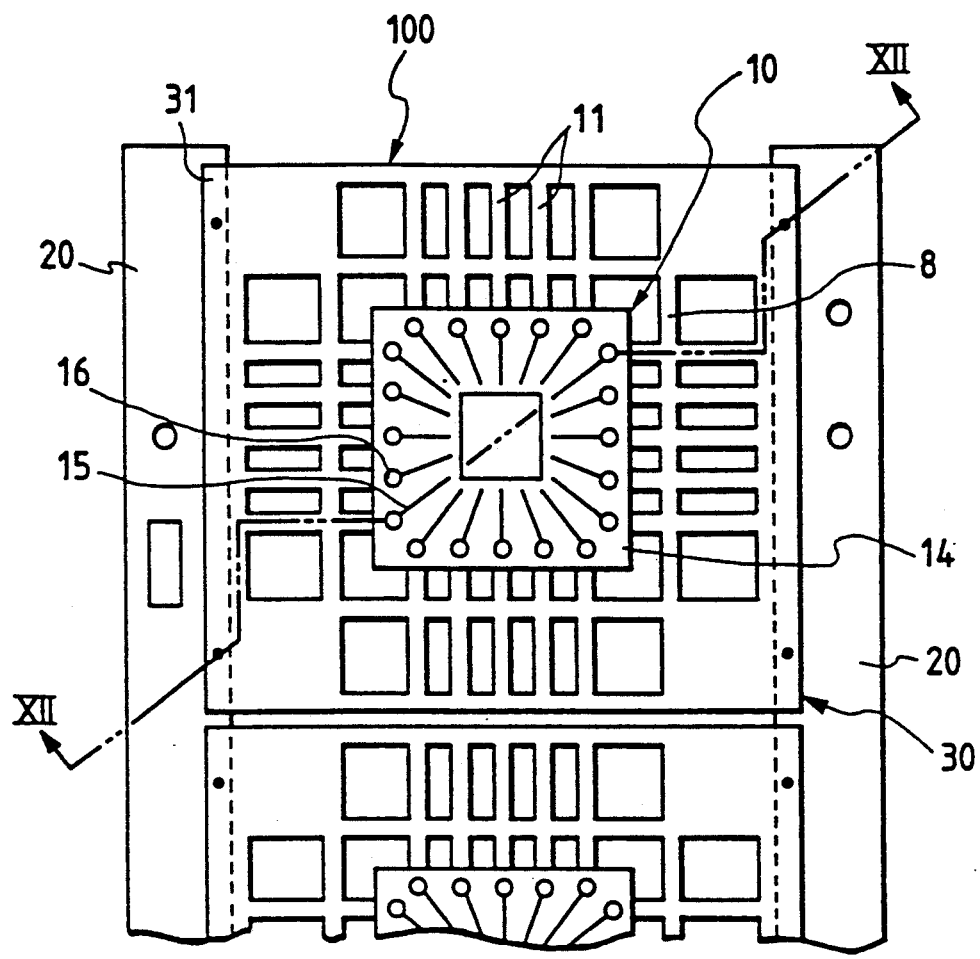
FIG. 11 is a partial plan view showing an electronic-parts mounting board frame according to a third embodiment of the invention.
Figure 12:
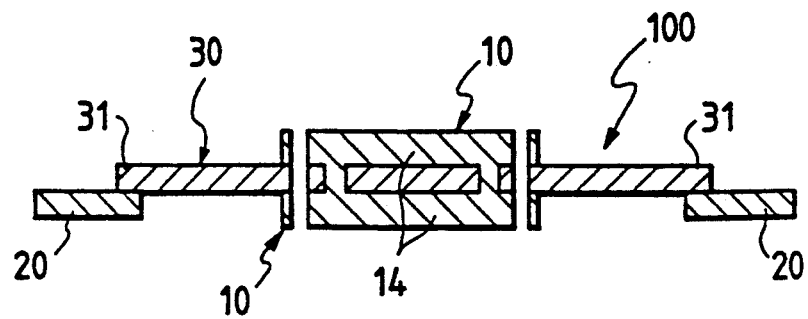
FIG. 12 is a sectional view taken on line XII—XII in FIG. 11.

A third embodiment of an electronic-parts mounting board frame 100 according to the present invention will be described with reference to FIGS. 11 to 17. In this embodiment, the electronic-parts mounting boards 10 are assembled into the frame 20 by using a lead frame 30. The lead frame 30 is formed by unifying groups of leads 11 by means of an outer frame 31. To be more specific, to form the lead frame 30, grouped leads 11 for the electronic-parts mounting board 10 are connected by means of tie bars. The external ends of the leads 11 are connected to the outer frame 31. An insulating board 14 is applied to both sides of the central part of the lead frame 30. Then, necessary conductive circuits 15 are formed on the structure, and through-holes 16 are formed in the structure. The electronic-parts mounting boards 10 thus constructed, as shown in FIGS. 11 and 12, are each fixed to one frame 20 at the peripheral edge 31 of the lead frame 30.

As described above, in the embodiment shown in FIGS. 11 and 12, the electronic-parts mounting boards 10 are assembled into the frame 20 by utilizing the outer frame 31 located at the tips of the leads 11. To fix frame 31 into frame 20, both sides of the outer frame 31 are placed on the frame 20, and spot welded at the black points shown in FIG. 11 by resistance welding.

Figure 19:
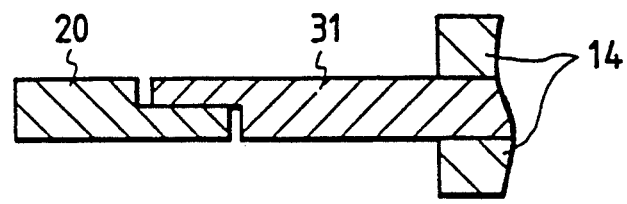
FIG. 19 is a sectional view showing another connection of the frame 20 and the outer frame 31.

In this case, the inner side of the frame 20 and both sides of the outer frame 31 may be half etched in order to form steps, as shown in FIG. 19. When frames 20 and 31 are coupled, the stepped parts are laid one upon the other. The jointed portions of the frame 20 and the outer frame 31 have smoothed surfaces. With the smoothed surfaces of the jointed portions, the electronic-parts mounting board frame 100 may be easily positioned in or on related devices as necessary. In this embodiment, the frame 20 and the lead frame 30 are both made of copper alloy.

Figure 13:
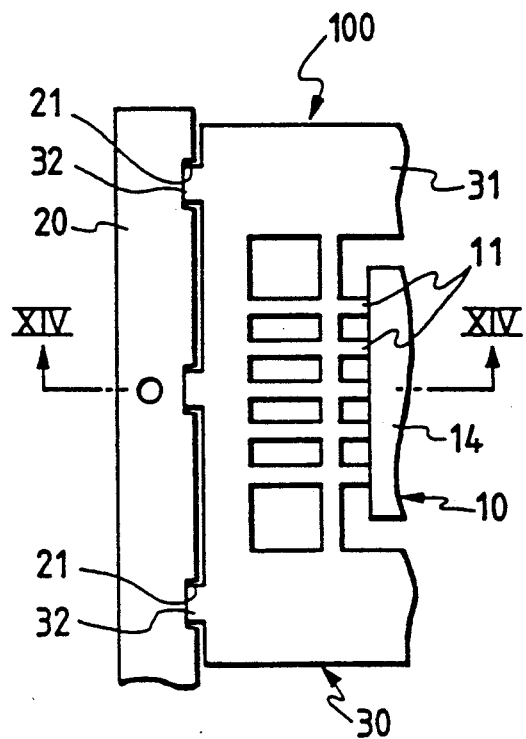
FIG. 13 is a partial, enlarged plan view showing a modification of the electronic-parts mounting board frame according to the third embodiment.

A modification of the coupling of the electronic-parts mounting boards 10 with the frame 20 is illustrated in FIGS. 13 and 14. In this modification, as shown, both sides of the outer frame 31 have portions 32 protruding therefrom. The inner sides of the frame 20 have indented portions 21 shaped with U-shaped cross sections. When coupling the inner and outer frames, the protruding portions 32 of frame 31 are inserted into the U-shaped indented portions 21 of frame 20, respectively, and are fixed by electron beams or seam welding. The electronic-parts mounting board 10 is automatically positioned with respect to the frame 20 when the protruding portions 32 are inserted into the indented portions 21. As a result, no stepped portions in the surface of the frame 20 are required. This provides a smooth positioning of the electronic-parts mounting board frames 100.

The embodiment of FIG. 13 may be further modified as shown in FIG. 19. In this modification, the faces of the protruding portions 32 which are to be jointed, and the indented portions 21, are half-etched to be stepped as shown. For coupling the board with the frame, the stepped portions are laid one upon the other. As in the previous modification, no stepped portions are formed in the jointed portion of the protruding portions 32 and the indented portions 21, providing for smooth frame positioning. The frame 20 and the lead frame 30 are both made of 42 alloy.

Figure 16:
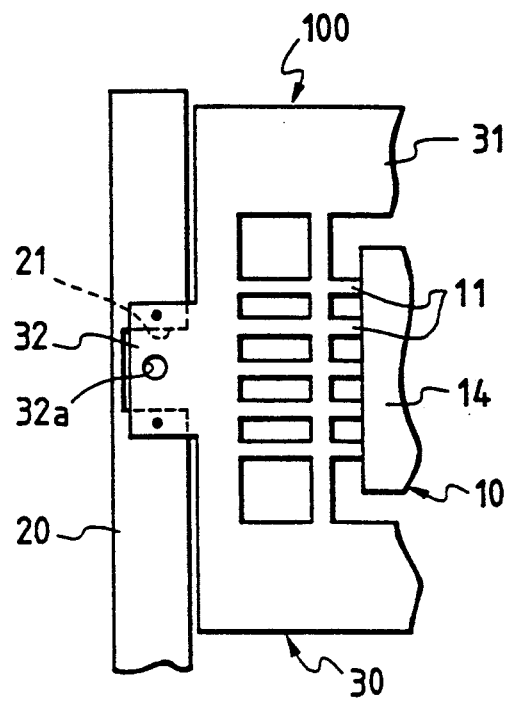
FIG. 16 is a partial, enlarged plan view showing an additional modification of the connection of the frame and the outer lead frame in the third embodiment.

A modification of the third embodiment of an electronic-parts mounting board frame 100 according to the present invention will be described with reference to FIG. 16. In this modification, the lead frame 30 and the frame 20 include, respectively a protruding portion 32 and an indented portion 21, as in the embodiment of FIG. 13. The protruding portion 32, which protrudes from a location at the midpoint of the side edge of the lead frame 30, is larger than the indented portion 21. The protruding portion 32 has a pilot hole 32a at the center. The pilot hole 32a is used when the electronic-parts mounting board frame 100 is transferred and the frame per se is applied to a related device. The protruding portion 32, when located at the midpoint of the side edge of the lead frame 30, reliably positions the electronic-parts mounting board 10 when work is applied to the board. The fact that the protruding portion 32 is larger than the indented portion 21, results in easy repositioning of the electronic-parts mounting board 10 in the frame 20. Spot welding by a YAG laser is applied to the overlapping portion of the protruding portions 32 within the frame 20, to couple them. In this embodiment, the frame 20 is made of copper ally, and the lead frame 30 is made of 42 alloy.

As described above, in the electronic-parts mounting board frame 100 according to the third embodiment shown in FIGS. 11 through 16, the grouped leads 11 for each electronic-parts mounting board 10 are coupled together by the outer frame 31, to form the lead frame 30. The outer frame 31 of the lead frame 30 of each electronic-parts mounting board 10 is assembled into the frame 20, to thereby form an electronic-parts mounting board frame 100. If one or more of the lead frames 30 of the electronic-parts mounting boards 10 assembled into the electronic-parts mounting board frames 100 is defective, the board 10 containing the defective lead frame 30 may be removed or replaced by a non-defective one. The remaining boards can be used as they are.

The conventional lead frame consists of a plurality of parts in order to form a number of electronic-parts mounting boards 10. On the other hand, in the present invention, the lead frames 30 for the electronic-parts mounting boards 10 are individually formed. In manufacturing the boards, the electronic-parts mounting board 10 experiences many manufacturing steps. For example, an electronic part 40 is mounted on the electronic-parts mounting board 10. To ease the manufacturing work, the outer frames 31 of the lead frames 30 of the electronic-parts mounting board are assembled into a single frame 20, as shown in FIG. 1

As described above, the present invention brings about many beneficial features.

In the electronic-parts mounting board frame 100 according to the first embodiment, a plurality of electronic-parts mounting boards 10 are assembled into one frame 20 and fixed to the frame by grouped leads 11, to thereby form a single piece construction. If any of the electronic-parts mounting boards 10 is defective, only the defective one is removed and replaced with a non-defective one, while the remaining non-defective boards are used as they are. Therefore, the cost to manufacture the electronic-parts mounting board 100 is reduced. Electrical testing of the electronic-parts mounting boards 10 can be accomplished before the electronic-parts mounting boards 10 are assembled into the frame 20. Therefore, the fixing work of the boards to the frame is efficiently done, and the production yield of the electronic-parts mounting board frames 100 is improved.

By assembling the electronic-parts mounting boards 10 into the frame 20, the electronic parts 40 may be efficiently mounted on the electronic-parts mounting boards 10. Particularly if the frames 20 each having a prescribed pattern are previously manufactured, the electronic-parts mounting boards 10 may be routinely assembled using an automated mounting device for mounting the electronic parts 40. Therefore, the electronic-parts mounting board frame 100 is especially convenient when semiconductor devices 200 are formed by the electronic-parts mounting boards 10.

In the electronic-parts mounting board frame 100, the leads 11 for each electronic-parts mounting board 10 include inner leads 11a and outer leads 11b. The inner leads 11a to which the insulating boards 14 are applied, and the outer leads 11b integral with the frame 20, are formed of different members. Accordingly, the electronic-parts mounting board frame 100 of this embodiment enjoys the same advantages as does the first embodiment. In particular, the inner lead frames 12, which are difficult to manufacture and expensive, may be used for each electronic-parts mounting board 10. This allows only the non-defective electronic-parts mounting boards 10 to be used for the electronic-parts mounting board frame 100. The result is to reduce the cost and improve manufacturing yield of the resultant electronic-parts mounting board frames 100.

Additionally, a number of the inner leads 11a and a number of the outer leads 11b, which make up the leads 11, may be previously manufactured. The conductive circuits 15 on the insulating board 14 are selectively connected to the inner leads 11a, through the through-holes 16. The electronic-parts mounting boards 10 thus manufactured have an excellent versatility in usage.

In the electronic-parts mounting board frame 100 of the third embodiment, the lead frames 30 are previously manufactured for the electronic-parts mounting boards 10. The lead frames 30 are assembled into and fixed to the frame 20 by the outer frames 31, to thereby form a single piece construction. Therefore, the third embodiment has advantages comparable with those obtained by the first embodiment.

Furthermore, in this embodiment, a number of leads 11 necessary for the electronic-parts mounting board 10 are unified by each outer frame 31, to thereby form lead frames 30. The lead frames 30 thus formed are assembled into and fixed to the frame 20 by the outer frames. Accordingly, the lead frames 30 may be formed individually, leading to cost reduction.

The lead frames 30 may be connected to the frame 20 in such a manner that protruding portions of the lead frames 30 are inserted into indented portions of the frame 20. In this case, the resultant electronic-parts mounting board frame 100 is entirely flat in shape. The positioning of the electronic-parts mounting boards 10 to the frame 20 is therefore simplified.

As seen from the foregoing description, the electronic-parts mounting boards 10 to be assembled into one frame 20 may be manufactured in different forms. This feature is very useful for the manufacture of small volumes of customized products. When the electronic-parts mounting boards 10 are connected to the frame 20 by laying the half-etched portions one upon the other, the resultant electronic-parts mounting board frame 100 is planar in shape. The planar shape provides, for example, for smooth positioning, of the electronic-parts mounting board frame 100 on a mounting device for mounting electronic parts 40.

Finally, it will be understood by those skilled in the art that the phrase electronic-parts mounting board refers to a board on which either a plurality of electronic parts or a single electronic part is mounted. The principles of the invention apply equally to either situation and it is consequently intended that the phrase electronic-parts mounting board as used in the above description and the appended claims be construed to mean any board on which at least one electronic part would be mounted.

A preferred embodiment of an electronic-parts mounting board frame sheet according to the present invention will now be described with reference to the accompanying drawing FIGS. 20-25.

Figure 20:
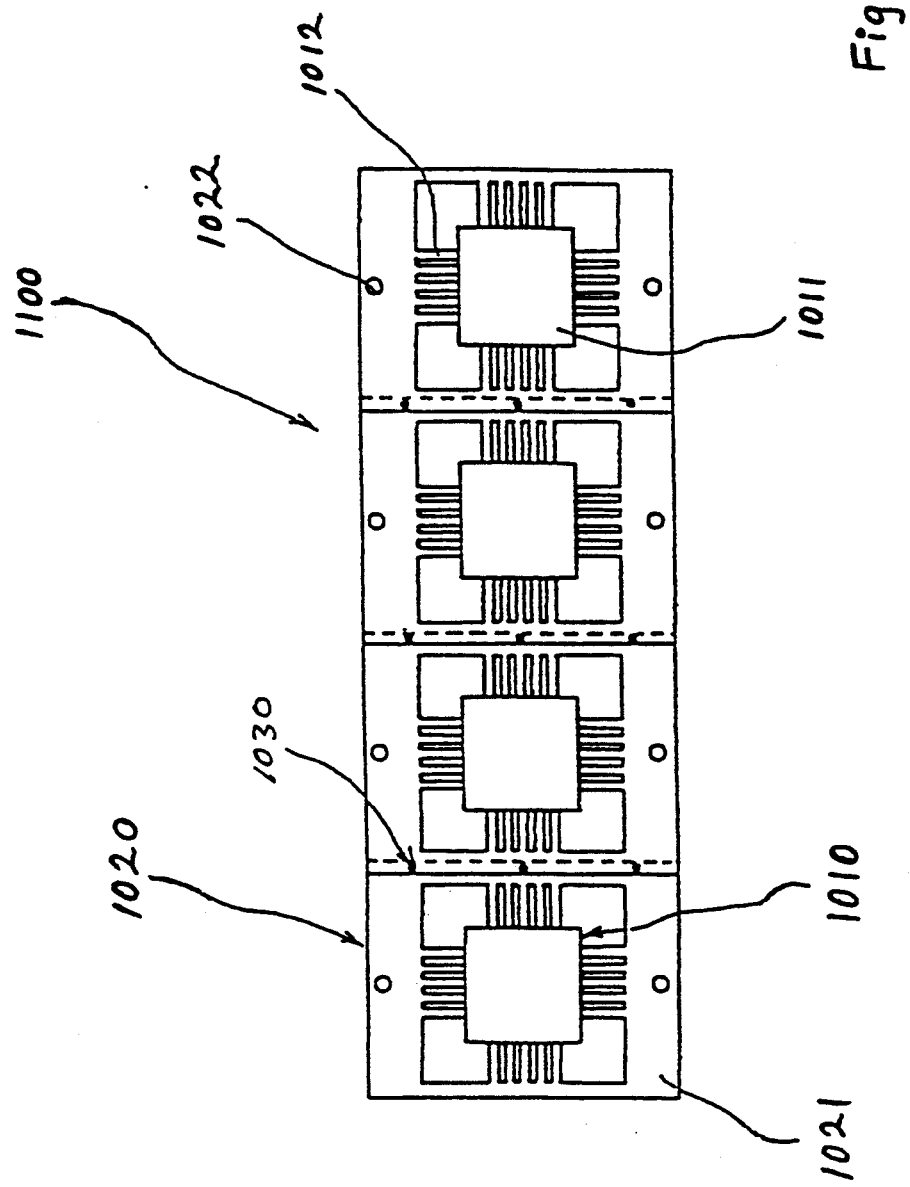
FIG. 20 is a plan view showing an electronic-parts mounting board frame sheet which constitutes another embodiment of the invention.
Figure 21:
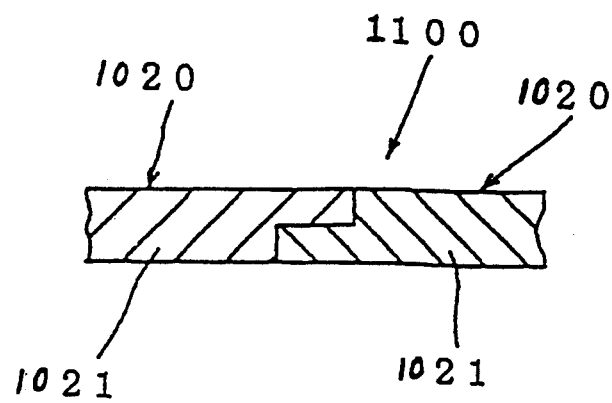
FIG. 21 is a cross-sectional view showing two electronic-parts mounting board frames coupled into an electronic-parts mounting board frame sheet.
Figure 22:
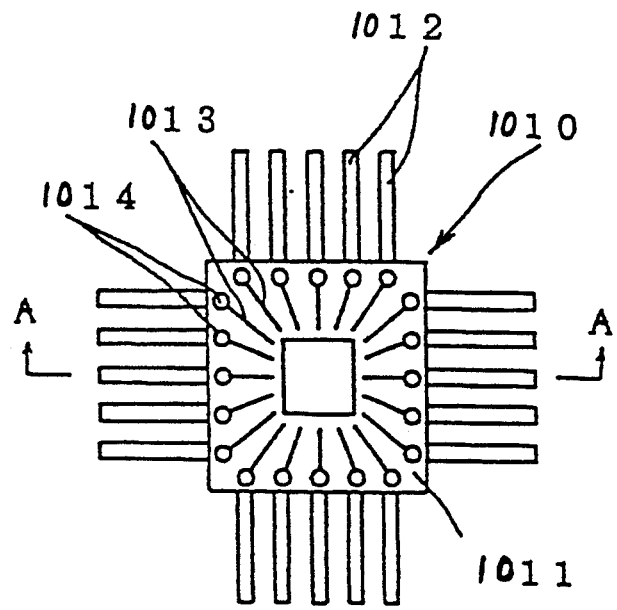
FIG. 22 is a plan view showing an electronic-parts mounting board with grouped leads used in the electronic-parts mounting board frame of FIG. 20.
Figure 23:
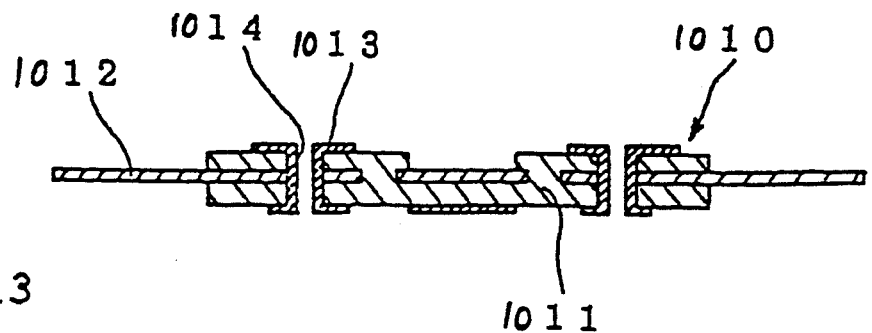
FIG. 23 is a cross-sectional view showing an electronic-parts mounting board with grouped leads.
Figure 24:
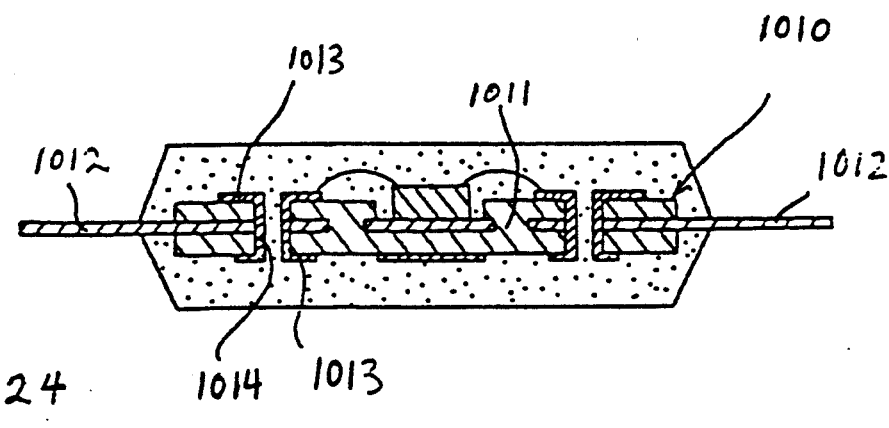
FIG. 24 is a vertical sectional view showing a semiconductor device constructed using the electronic-parts mounting board of FIG. 23.

FIG. 20 is a plan view showing an electronic-parts mounting board frame sheet (hereinafter referred to as a frame sheet) 1100 according to another preferred embodiment of the present invention.

Figure 25:
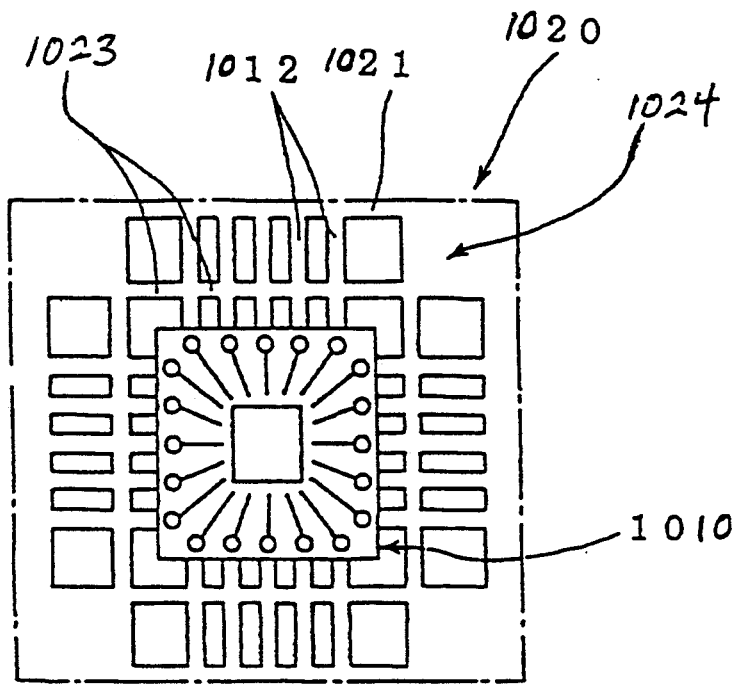
FIG. 25 is a plan view showing an electronic-parts mounting board frame used in the electronic-parts mounting board frame sheet of FIG. 20.

A plurality of electronic-parts mounting board frames 1020 are serially coupled to form the frame sheet 1100. The board frame 1020, as shown in FIG. 25, includes an electronic-parts mounting board 1010 (FIGS. 22 and 23), an outer frame 1021 connecting the outer end parts of groups leads 1012 to fix them, and dam bars 1023, if required.

A copper plate is punched to form a lead frame 1024 with a pattern having the groups of leads 1012, the outer frame 1021, and the dam bar 1023. At this time, the pilot holes 1022, which are for indicating the positions of the groups of leads 1012, are also formed in the outer frame 1021. Insulating substrates 1011 are thermally pressed on both sides of the lead frames 1024 thus formed. Semiconductor circuits 1013, through-holes 1014, and the like are formed on the insulating substrates 1011. In this way, an electronic-parts mounting board frame 1020 is formed.

A plurality of electronic-parts mounting board frames 20 thus formed are serially coupled together into an electronic-parts mounting board frame sheet 1100. To couple the electronic-parts mounting board frames, the end parts of each board frame 1020, as shown in FIG. 2, are half-etched to form a stepped end part. The stepped end part of one board frame 1020 is placed on a stepped end part of the adjacent board frame 1020, and the stepped end parts placed one upon the other are bonded together by spot welding to form spot welds 1030, for example. In the thus formed frame sheet 1100, the coupled portions of the board frames 20 have smoothed surfaces, ensuring a smooth transfer of the frame sheet 1100 when it is transferred.

In this embodiment, the stepped end parts of the board frames 1020 are used to couple the board frames 1020 together. Alternatively, the board frames 1020 can be coupled in such a manner that the end face of one board frame 1020 abuts against the end face of another board frame 1020 adjacent to the former, and under this condition welding, adhesive, or another suitable coupling means is applied to the boundary part of the two adjacent board frames 1020.

As described above, the plurality of electronic-parts mounting board frames 1020, as shown in FIG. 20, are serially connected together to form the electronic-parts mounting board frame sheet 1100. Preferably, only non-defective board frames 1020 are selected for the sheet from among a group of pre-manufactured electronic-parts mounting board frames. Accordingly, the sheet 1100 does not contain any defective electronic-parts mounting board frames and therefore is especially reliable.

When the frame sheet 1100 is transferred to subsequent process stages and processed therein, it is possible that a board frame or board frames may become damaged. If damaged, however, the defective one or ones need be replaced with nondefective one or ones, without having to replace the entire sheet. Accordingly, the remaining board frames 1020 of the frame sheet 1100 can still be utilized, avoiding waste of non-defective board frames. This leads to improvement of the production yield.

The pilot holes 1022 are formed in the outer frame 1021 of each board frame 1020. When the unnecessary outer frame 21 or a dam bar 1023 (FIG. 25) are removed, the pilot holes 1022 are used for indicating the positions of the groups of leads 1012. The outer frame 1021, dam bar 1023, and grouped leads 1012 are integrally formed into a single piece as the lead frame 1024. In the process step for the resin sealing, the board frame 1020 is thermally expanded. In this case, no distortion is created between each pilot hole 1022 of the outer frame 1021 and the related group of leads 1012. Therefore, the position of the pilot hole 1022 relative to the grouped leads 1012 remains unchanged, providing an exact positional relationship between the pilot hole and the related grouped leads.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. In an electronic-parts mounting board frame sheet having a plurality of electronic-parts mounting board frames, each frame including an electronic-parts mounting board with an insulating substrate, grouped leads protruding from said insulating substrate, an outer frame, and means including pilot holes located in said outer frame, for indicating positions of said grouped leads on said electronic-parts mounting board, the improvement wherein said plurality of electronic-parts mounting board frames are serially coupled into a single sheet.

2. An electronic-parts mounting board frame sheet according to claim 1, in which said grouped leads and said outer frame of each said electronic-parts mounting board frame are integrally formed.

3. An electronic-parts mounting board frame sheet according to claim 1, in which said plurality of electronic-parts mounting board frames comprise only nondefective frames selected from among pre-manufactured electronic-parts mounting board frames.

4. An electronic-parts mounting board frame sheet according to claim 1, wherein at least one end part of each said electronic-parts mounting board frame is a step-shaped end part, and wherein a step-shaped end part of one of said electronic-parts mounting board frames is situated on a stepped end part of an adjacent one of said electronic-parts mounting board frames and bonded thereto.

5. An electronic-parts mounting board frame sheet according to claim 4, wherein the step-shaped end parts of adjacent ones of said electronic-parts mounting board frames are spot welded together.

6. An electronic-parts mounting board frame sheet according to claim 2, in which said plurality of electronic-parts mounting board frames comprise only nondefective frames selected from among pre-manufactured electronic-parts mounting board frames, 7. An electronic-parts mounting board frame sheet according to claim 2, wherein at least one end part of each said electronic-parts mounting board frame is a step-shaped end part, and wherein a step-shaped end part of one of said electronic-parts mounting board frames is situated on a stepped end part of an adjacent one of said electronic-parts mounting board frames and bonded thereto.

8. An electronic-parts mounting board frame sheet according to claim 7, wherein the step-shaped end parts of adjacent ones of said electronic-part mounting board frames are spot welded together.

* * * * *